United States Patent
Van Nieuwenhoven

(10) Patent No.: US 6,643,228 B1
(45) Date of Patent: Nov. 4, 2003

(54) METHOD AND DEVICE FOR RECORDING REAL-TIME INFORMATION INCLUDING PLAYBACK PARAMETERS

(75) Inventor: Marcel S. E. Van Nieuwenhoven, Eindhoven (NL)

(73) Assignee: Koninklijke Philips electronics N.V., Eindhoven (NL)

( * ) Notice: Subject to any disclaimer, the term of this patent is extended or adjusted under 35 U.S.C. 154(b) by 0 days.

(21) Appl. No.: 09/479,638

(22) Filed: Jan. 7, 2000

(30) Foreign Application Priority Data

Jan. 8, 1999 (EP) .............................. 99200040

(51) Int. Cl.[7] .............................................. G11B 21/08
(52) U.S. Cl. ................ 369/32.01; 369/53.41; 369/30.04
(58) Field of Search ............... 369/32.01, 53.41, 369/30.04, 275.3, 30.15, 30.08, 44.26, 47.1, 53.12, 53.13, 53.2; 386/126

(56) References Cited

U.S. PATENT DOCUMENTS 6,091,674 A * 7/2000 Tozaki et al. ............. 369/30.04
6,108,281 A * 8/2000 Tozaki et al. ............. 369/30.01
6,359,844 B1 * 3/2002 Frank ....................... 369/32.01

FOREIGN PATENT DOCUMENTS

| EP | 0676895 A2 | 10/1995 |
| EP | 0729153 A2 | 8/1996 |
| EP | 0752705 A2 | 1/1997 |
| EP | 0903738 A2 | 3/1999 |
| WO | WO9816014 | 4/1998 |

* cited by examiner

*Primary Examiner*—Ali Neyzari

(57) ABSTRACT

In a method of recording real-time information on an information carrier, e.g. audio on an optical disc, the real-time information is compressed to units comprising a variable amount of compressed data, and playback parameters are determined in dependence of the compressed data. The playback parameters comprise an access list (Main_Acc_List) having entries, each subsequent entry being assigned to a subsequent interval of a fixed playback time and comprising a pointer (Entry[N]) to a unit within said interval. In a player the real-time information may be accessed at a selected point of playing time. The corresponding entry in the access list is determined by dividing the selected time by the interval. The entry provides the pointer (Entry[N]) to the unit corresponding to the selected playing time. Interpolation may be used for calculating an address at a selected playing time within an interval, and the accuracy may be improved by a margin parameter (Access_Flags[N]), which indicates the maximum distance between the unit of the selected playing time and the interpolated address.

5 Claims, 3 Drawing Sheets

Figure 1A:
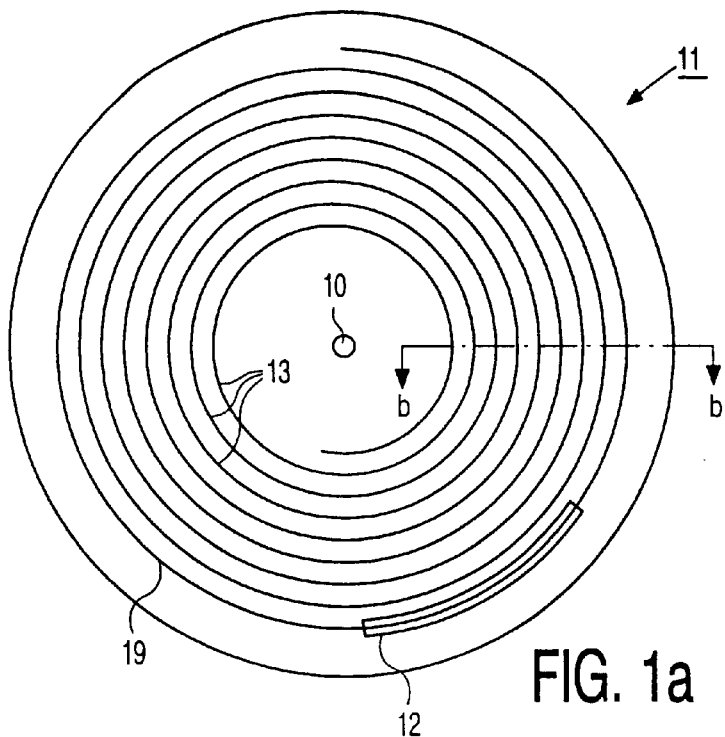

|  | # bytes | format |
|---|---|---|
| Access_List ( ) { | | |
|     Access_List_Signature | 8 | String |
|     N_Entries | 2 | Uint16 |
|     Main_Step_Size | 1 | Uint8 |
|     Reserved | 5 | Uint8 |
|     Main_Acc_List ( ) | | Main_Acc_List |
|     Reserved2 | until 65536 | Uint8 |
| } | | |

FIG. 2

|  | # bytes | format |
|---|---|---|
| Main_Acc_List ( ) { | | |
|     for  (N=0; N<N_Entries; N++) | | |
|     { | | |
|         Access_Flags [N] | 2 | Access_Flags |
|         Entry [N] | 3 | Uint24 |
|     } | | |
| } | | |

FIG. 3

METHOD AND DEVICE FOR RECORDING REAL-TIME INFORMATION INCLUDING PLAYBACK PARAMETERS

The invention relates to a method of recording real-time information and playback parameters related thereto on an information carrier, in which method the real-time information is compressed to units comprising a variable amount of compressed data, and the playback parameters are determined in dependence of the compressed data.

The invention further relates to a recording device for recording real-time information on an information carrier, the device comprising processing means for compressing the real-time information to units comprising a variable amount of compressed data, processing means for generating playback parameters in dependence of the compressed data, and recording means for recording the compressed data and the playback parameters.

The invention further relates to an information carrier carrying real-time information and playback parameters related thereto, the real-time information being represented by units comprising a variable amount of compressed data.

The invention further relates to a playback device for playing back real-time information from the information carrier, the device comprising reading means for retrieving from the information carrier the units and playback parameters, and processing means for processing the playback parameters.

A method of recording real-time information on an information carrier is known from PCT application WO 98/16014 (PHN 16452). Real-time information is information having a real-time nature to be reproduced at a prescribed rate, usually audio or video information, or a combination of audio and video. In the known method audio information is encoded digitally and compressed into units, which represent short segments of the audio signal and usually have a fixed duration of playback time, e.g. 15 msec. The compression rate is variable and responds to the complexity of the real-time information, so it results in a compressed data signal with a variable bitrate. Therefore the length of the units, i.e. the amount of compressed data to be stored per unit, is variable. The reproduction of the audio information requires all compressed data of the respective units, and so reading has to start at the beginning of a unit. The compressed data may be recorded on an information carrier, e.g. an optical disc like the CD, which usually comprises several musical items (usually called tracks), for example each comprising a song. Playback parameters for accessing and reproducing the real-time information are generated for enabling playback functions. For example for an audio CD a Table of Contents (TOC) is generated and stored on the information carrier, which TOC comprises pointers to the locations of the items for accessing the items. Also parameters indicative of the playing time of the items are included in the TOC. Hence the TOC on a CD can be used to access the recorded audio at the start of an item, i.e. at the playing time corresponding to the start of the item. However the TOC cannot be used for directly accessing the recorded audio at a selected point of playing time within an item.

It is an object of the invention to provide recording and payback means for more flexible accessing the recorded real-time information.

For this purpose, the method as described in the opening paragraph is characterized in that the playback parameters comprise an access list having entries, each subsequent entry being assigned to a subsequent interval of a fixed playback time and comprising a pointer to a unit within said interval. This has the effect, that for an arbitrarily selected playing time the pointer of a unit at the selected point of playing time can be easily determined from the access list, in particular because the interval has a fixed size, e.g. 1 second.

The invention is also based on the following recognition. For audio recordings in the prior art, such as on a CD, the TOC contains item start addresses and playing time data, and allows accessing the audio on a item by item basis. Intermediate points in playing time within an item may be calculated from the starting address of the item and the playing time within the item up to the selected point, because there is a fixed relation between the playing time and the amount of data of the stored digital audio signal. For a variably compressed real-time signal no fixed relation exists. Using linear interpolation for an item based on the start and end points of the item from a TOC could result in a large inaccuracy. For example when a musical item starts with a part which is easy to compress, and ends with a part which is difficult to compress part, any interpolation to a point in time in the middle of said item would be severely biased towards the end of the item. Also scanning the music at a higher speed by jumping fixed distances and then reproducing a unit would result in a relatively high speed in the first part, and a low speed in the second part. The inventors have recognized, that the new access list according to the invention allows accurate accessing of selected points of playing time within a recorded real-time signal of a variable bitrate.

An embodiment of the method according to the invention is characterized in that the playback parameters include a length parameter indicative of said fixed playback time. Hence the step size within the access list is set by the interval length. This has the advantage, that the number of entries in the access list can be adapted to the requirements of the recorded signal or the required accuracy.

A further embodiment of the method according to the invention is characterized in that the playback parameters include a margin parameter indicative of a correction of a calculated pointer of a unit within the interval. Access to a point in time within an interval may be required, and interpolation may be used to calculate a pointer. However, as the calculated pointer may be after the actual position of the wanted point in time, a margin may be added for starting the reading process before said ,calculated pointer. By determining the actually required margin during recording, and including the maximum value of said actually required margin in the playback parameters, the playback device can interpolate and correct the interpolated pointer by the margin retrieved from the playback parameters. This has the advantage, that the read process will always start shortly before or at the unit of the selected point in time.

According to the invention the recording device as described in the opening paragraph is characterized as claimed in claim 4. The effects and advantages of the information carrier and the recording and/or playback device have been explained above with reference to the method. Further preferred embodiments of the method, devices and information carrier according to the invention are given in the dependent claims.

Figure 4:
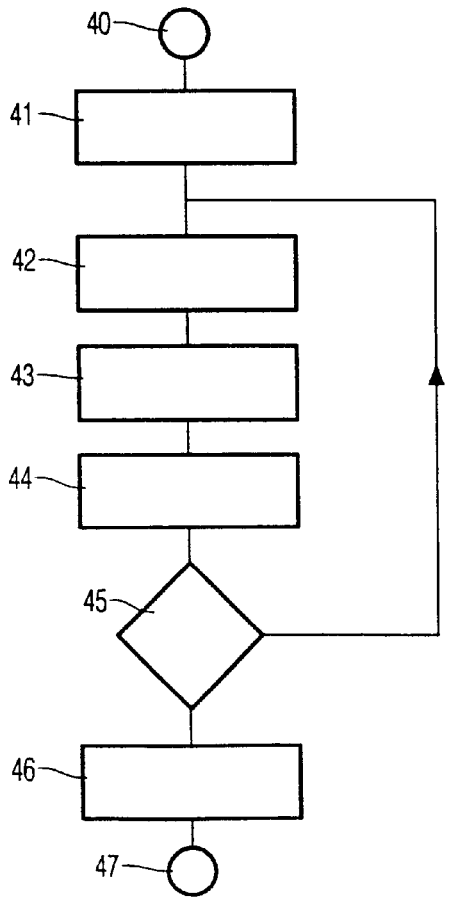
Figure 5:
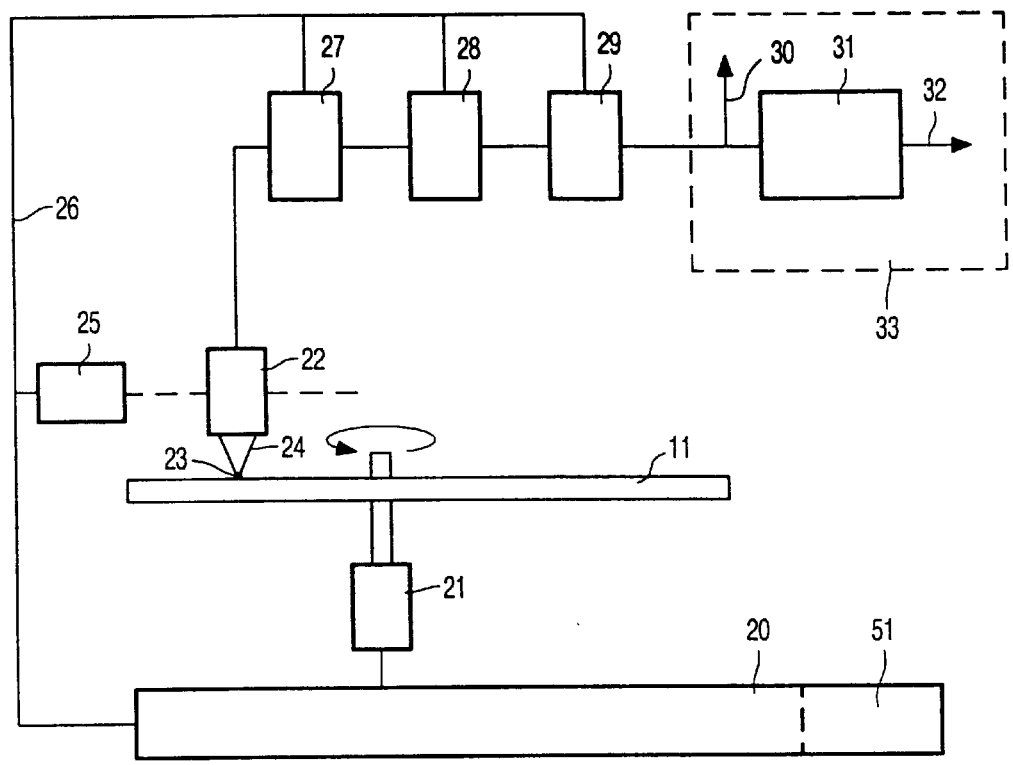
Figure 6:
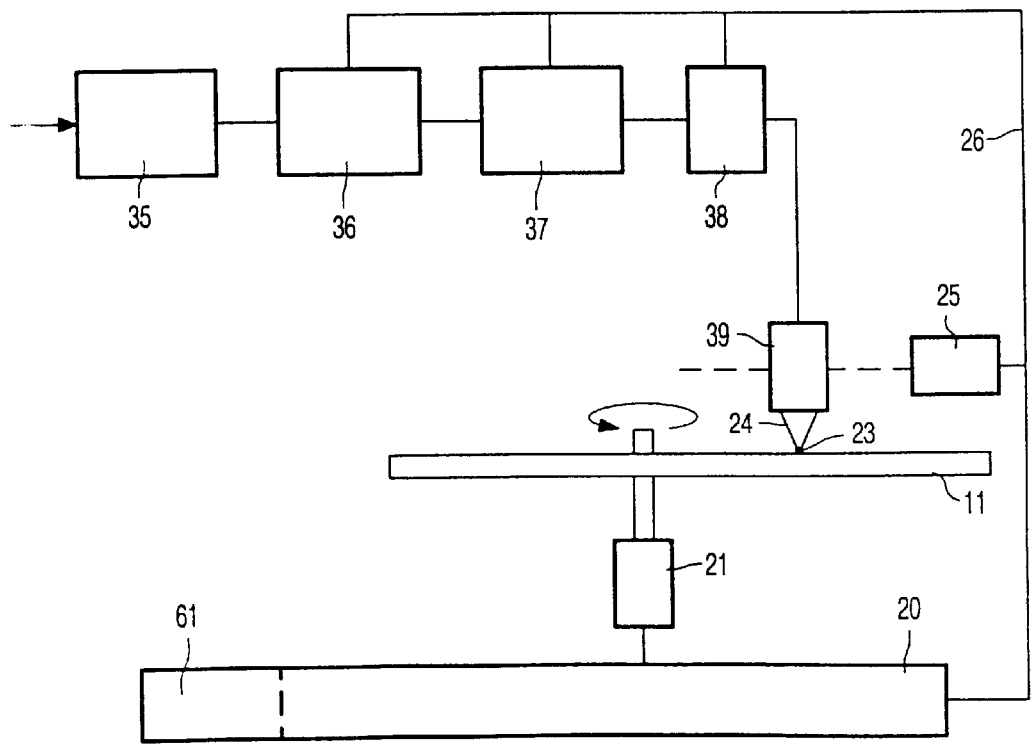

These and other aspects of the invention will be apparent from and elucidated further with reference to the embodiments described by way of example in the following description and with reference to the accompanying drawings, in which FIG. 1 shows a record carrier, FIG. 2 shows a syntax of Access_List FIG. 3 shows a syntax of Main-Acc_List FIG. 4 shows a method for determining the access margin FIG. 5 shows a playback device, and FIG. 6 shows a recording device Corresponding elements in different Figures have identical reference numerals.

FIG. 1a shows a disc-shaped record carrier 11 having a track 19 and a central hole 10. The track 19 is arranged in accordance with a spiral pattern of turns constituting substantially parallel tracks on an information layer. The record carrier may be an optical disc having an information layer of a recordable type or of a prerecorded type. Examples of a recordable disc are the CD-R and CD-RW, and the DVD+RW, whereas the audio CD is an example of a prerecorded disc. The prerecorded type can be manufactured in a well known way by first recording a master disc and via intermediate steps subsequently pressing consumer discs. The track 19 on the recordable type of record carrier is indicated by a pre-embossed track structure provided during manufacture of the blank record carrier. The information is represented on the information layer by optically detectable marks recorded along the track. The marks have different optical properties or magnetic direction than their surroundings, e.g. pits and lands.

Figure 1B:
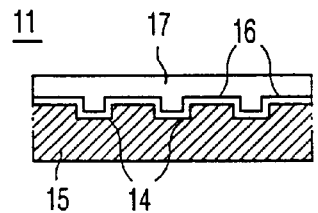

FIG. 1b is a cross-section taken along the line b—b of the record carrier 11 of the recordable type, in which a transparent substrate 15 is provided with a recording layer 16 and a protective layer 17. The track structure is constituted, for example, by a pregroove 14 which enables a read/write head to follow the track 19 during scanning. The pregroove 14 may be implemented as an indentation or an elevation, or may consist of a material having a different optical property than the material of the pregroove.

The record carrier carries real-time information, for example audio information, which is subdivided in items (also called tracks) for the convenience of the user. Such an item may have a playing time of a few minutes, e.g. songs of an album or movements of a symphony. Usually playback information for identifying the items is provided on the record carrier, e.g. in a so called Table Of Contents (TOC) or included in a file system like ISO 9660 for CD-ROM or UDF for DVD. The playback parameters may include the playing time and a start address for each item, and also further information like a song title. The playback information is located according to a predefined format, e.g. recorded on a predefined location on the record carrier, usually in or directly after the lead-in area. Alternatively the playback information may be included in a file with a predefined name, or a pointer on a predefined location indicates the whereabouts of the playback information.

The audio information is recorded in a digital representation after analog to digital (A/D) conversion. Examples of A/D conversion are PCM 16 bit per sample at 44.1 kHz as known from CD audio and 1 bit Sigma Delta modulation at a high oversampling rate e.g. 64 times the sample frequency (Fs), usually called bitstream. Bitstream conversion is a high quality encoding method, with the options of a high quality decoding or a low quality decoding with the further advantage of a simpler decoding circuit. After A/D conversion the digital audio is compressed to compressed audio data, which has a variable bitrate and is recorded on the information layer, as described in the document mentioned in the introduction. Compression is required for achieving a convenient total playing time and high quality and/or multi-channel sound. The compression operates on units of digital audio, usually of a predefined playing time, e.g. at 75 units/sec. Parameters of the audio signal of a unit and further information, e.g. a residual signal, are transmitted for each unit. The compression encodes the real-time information with a variable number of bits, hence the units have a variable amount of compressed data. The compressed data is to be read from the record carrier at such a speed that, after decompression, substantially the original timescale of the real-time information is restored when reproducing. Hence the compressed data must be retrieved from the record carrier at a varying bitrate.

According to the invention the playback parameters on the information carrier comprise an access list 12, schematically shown in FIG. 1a. The access list 12 has entries comprising access information, each subsequent entry being assigned to a subsequent interval of a fixed playback time. The access list 12 may be stored on the information carrier in a separate file or may be part of a data structure comprising further playback parameters, e.g. defined in a standard. An example of a syntax of an access list is described below with reference to FIGS. 2 and 3. The playing time of the interval is selected at a practical value, e.g. 1 sec, or a fixed number of units, e.g. 100 units, for allowing easy determination of the access point for any selected point in playing time. By dividing the selected access time by the interval length, the corresponding entry in the access list is derived. An entry comprises a pointer to a unit within said interval, usually the first unit. Playback may start at the beginning of a unit, i.e. at the address indicated by said pointer. It is to be noted, that the access list has a different function than a TOC. The TOC is organized as a list of reproducible items allowing to start the reproduction of the recorded signal at the beginning of the item, whereas the access list is organized according to playing time in fixed size steps allowing direct access to any selected point in playing time, e.g. for scanning music at a high speed or repeating a certain fragment between arbitrarily selected points. In an embodiment of the invention the pointer indicates the last unit in an interval. This has the advantage that the unit before the starting unit can be retrieved for presetting a decompressor. In a further embodiment the playback parameters include a length parameter indicative of said fixed playback time. Setting the fixed playback time of the interval enables selecting the accessing accuracy and the total size of the access list. In this embodiment the length parameter may be selected substantially inversely proportional to a total playing time of the real-time information to be recorded. This has the effect, that the access list may be read into a memory of a fixed size, whereas the maximum accuracy is achieved for accessing the real time information for the given memory size.

FIG. 2 shows a syntax of Access_List. Access_List is-an example of the above described access list, and contains a table with Start Addresses associated with Time Codes for an area with compressed audio data on an information carrier. The pointer for a wanted Time Code T is the Logical Sector Address of the sector that contains the first byte of a multiplexed frame T, which frame contains the respective unit of compressed audio data. Access_List has a fixed size of 65536 Bytes (32 Sectors). The length and format of each item in the Access_List are given (e.g. Unit 16 meaning an unsigned integer of 16 bits). Access_List Signature is an 8 byte string identifying the first Sector of Access_List. The value of Access_List_Signature may for example be "SACD_ACC". N_Entries contains the number of Entries in Main_Acc_List. The relation between N_Entries, Total_Play Time and Main_Step_Size is defined in the following formula:

$$N\_Entries = 1 + \frac{Total\_Play\_Time - 1}{Main\_Step\_Size}$$

In this formula Total_Play_Time and Main_Step_Size are expressed in units. The maximum allowed value of N_Entries is 6550 for a size of Main_Access_List of 32768 bytes and a size of an Entry of 5 bytes. The area with recorded data is divided into Intervals of Main_Step_Size units. For every Main_Step_Size units, the Start Address of the Multiplexed Frame is encoded in Main_Acc_List. Main_Step Size may be a multiple of 10 for easy calculation. Main_Acc_List contains the Start Addresses of the Multiplexed Frames at intervals of Main_Step_Size units. The section reserved2 may contain further access information, e.g. Sub_Access information.

In an embodiment the playback parameters include a margin parameter indicative of a correction of a calculated pointer of a unit within the interval. For accessing a unit at a point of playing time within an interval no pointer is available in the access list. The pointer for such a unit may be calculated by interpolation. However a difference may exist between the interpolated pointer and the actual pointer to the wanted unit. A margin parameter must be added to the calculated pointer to arrive at a pointer at (or shortly before) the wanted unit. After positioning the reading head the reading may be started and any data read before the wanted unit can be discarded. In an embodiment the margin parameter is determined for substantially each interval individually, and included in the respective entry in the access list. Alternatively one margin parameter may be determined for a larger area on the information carrier, e.g. one margin parameter for every 10 intervals, or for the entire information carrier. In the above example (described with reference to FIG. 2) for each encoded Start_Address, Main_Acc_List contains the margin parameter Access_Margin to estimate the intermediate Start Addresses. Alternatively an entry may contain the margin parameter or a pointer to further access information, e.g. in Sub_Access information.

FIG. 3 shows the syntax of Main_Acc_List. The Main_Acc_List has for each Interval [N] a description Access-Flags[N] and a pointer Entry[N]. The Access_Flags[N] has a format Access_Flags, containing for Interval[N] either a pointer to further access information (e.g. in an area Sub_Access), or the Access_Margin that is needed to estimate the Start Address for a given Time Code within the respective interval. In an embodiment Access_Flags contains a bit Sub_Access[N], which, if set to one, indicates that for Interval[N] further access information is encoded in Sub_Access. A pointer Sub_Access_Ptr[N] is available to locate the further access information. If Sub_Access[N] is set to zero, in Interval[N] the Start Address can be estimated by linear interpolation modified with Access_Margin[N]. For the last Interval in an Audio Area, Sub_Access[N] must be set to zero.

Access_Margin contains a correction factor for the calculation of the estimated Start Address in between two Entries, i.e. indicates the maximum distance between the unit of the selected playing time and the interpolated address. The estimated Start Address for a given Time Code T, can be calculated with the following formulas, in which the linear interpolated address is indicated as Interp_Address[T]:

Estimated Start_Address[T]=Max (Entry[N], Interp_Address[T]–Access_Margin[N])

$$N = Trunc\left(\frac{T}{Main\_Step\_Size}\right)$$

$$Interp\_Address[T] = Entry[N] + \frac{(T \bmod Main\_Step\_Size) * (Entry[N+1] - Entry[N])}{Main\_Step\_Size}$$

T is the selected Time Code expressed in units, Entry[N] contains the Start_Address of Multiplexed Frame[N*Main-Step_Size]. Access_Margin[N] must contain the largest value of Interp_Address[T]–Start_Address[T], where Start_Address[T] is the start address of Multiplexed Frame T. For the last Interval of a Track Area, a different calculation method for Interp_Address[T] is used, in which Total_EA is the End Address of the recorded area:

$$Interp\_Address[T_{last}] = Entry[N] + \frac{(T \bmod Main\_Step\_Size) * (Total\_EA - Entry[N])}{1 + ((Total\_Play\_Time - 1) \bmod Main\_Step\_Size)}$$

FIG. 4 shows a method for determining the access margin. The access margin may be determined for each interval and/or a global access margin may be determined for the total recorded area. After starting at 40 (START) the recording of audio input in a first step 41 (SET) the fixed playing time of the interval is set, e.g. 75 units for an interval length of one second, and the initial value for the global access margin is set to 0. In a second step 42 (COMPRESS) an interval of audio is compressed to units, and the start addresses are kept in a temporary memory. In a third step 43 (INTERPOLATE) interpolated start addresses for all units in the interval are calculated by linear interpolation. In a fourth step 44 (COMPARE, KEEP LARGEST) the interpolated addresses are compared with the stored actual addresses, and the largest negative value of the difference is the access margin for that interval N:

Access_Margin[N]. The value Access_Margin[N] may be entered in the access list for the interval[N], and/or may be compared with the global access margin to determine a largest value to be the updated global access margin. In a test 45 (NEXT) it is decided if the recording is completed. If there is a next interval, the process is repeated from the second step 42. If the recording is finished, in a step 46 (STORE ACCESS) the global access margin may be entered in the access list and the access list is stored on the information carrier.

FIG. 5 shows a playback device for reading a record carrier 11, which record carrier is identical to the record carrier shown in FIG. 1. The device is provided with drive means 21 for rotating the record carrier 1, and a read head 22 for scanning the track 19 on the record carrier. The apparatus is provided with positioning means 25 for coarsely positioning the read head 22 on the track in the radial direction (perpendicular to the length direction of the track). The read head comprises an optical system of a known type for generating a radiation beam 24 guided through optical elements and focused to a radiation spot 23 on a track of the information layer of the record carrier. The radiation beam 24 is generated by a radiation source, e.g. a laser diode. The read head further comprises a focusing actuator for moving the focus of the radiation beam 24 along the optical axis of said beam and a tracking actuator for fine positioning of the spot 23 in a radial direction on the center of the track. The tracking actuator may comprise for example coils for radially moving an optical element or means for changing the angle of a reflecting element with respect to the optical axis of the beam 24. The radiation reflected by the information layer is detected by a detector of a usual type, e.g. a four-quadrant diode, in the read head 22 for generating a read signal and further detector signals including a tracking error and a focusing error signal, which are applied to said tracking and focusing actuators. The read signal is processed by a retrieving means 27 to retrieve the data, which reading means are of a usual type for example comprising a channel decoder and an error corrector. The retrieved data is passed to a data selection means 28. The data selection means selects the compressed audio data from all data read and passes the compressed audio data to buffer 29. The selection is based on data type indicators also recorded on the record carrier, e.g. headers in a multiplexed frame. The compressed audio data is passed on from buffer 29 to a de-compressor 31 via signal 30. This signal may also be available as an output signal to an external de-compressor. The de-compressor 31 decodes the compressed audio data to reproduce the original audio information on output 32. It is to be noted, that the de-compressor 31 may be separate from the reading means, e.g. in a stand alone housing combined with a high quality audio digital to analog converter (D/A converter), as indicated by the dashed rectangle 33 in FIG. 5. It is to be noted, that alternatively the buffer may be positioned before the data selections means, and may be arranged for storing at least the data of a full turn 13 of the track. In such configuration the data may be read from the disc at high speed, and as soon as the buffer 29 is full, reading is interrupted and the beam 24 is moved backwards. The device is further provided with a control unit 20 for receiving commands from a user or from a host computer for controlling the apparatus via control lines 26, e.g. a system bus, connected to the drive means 21, the positioning means 25, the retrieving means 27 and the data selection means 28, and possibly also to buffer 29 for buffer filling level control. To this end, the control unit 20 comprises control circuitry, for example a microprocessor, a program memory and control gates, for performing the procedures described below. The control unit 20 may also be implemented as a state machine in logic circuits.

According to the invention the control unit 20 and the data selection means 28 are arranged for retrieving from the data read playback parameters, in particular the access list. A command for accessing the recorded audio at a selected playing time is performed as follows. First a control area is read from disc and the access list is retrieved from the read signal by the data selection means 28. The control unit 20 divides the selected playing time by the fixed playing time of the interval, and truncates the value. The resulting entry is located in the access list using truncated value as index. The entry contains a pointer to a start address of a unit of the playing time of that interval, and the read head is moved to the start address. The reading process is started at the start address, and the data is analyzed by the data selection means 28 to locate the actual start of the unit with the selected time. The data read up to that unit is discarded, and the reproduction is started when the selected unit arrives, which may take on average half the interval time. However usually a shorter time is needed, as the reading is performed at a higher speed as described above. The start of a unit is recognized in the usual way by detecting a synchronizing pattern or a header structure. In an embodiment the control unit 20 is arranged for calculating a pointer to a unit within an interval by interpolating between pointer values of two adjacent entries. Linear interpolation may be used between the first unit of the selected interval and the first unit of the next interval. In the event that the interpolated address proves to be past the specified unit, the device may be arranged just to accept the difference, i.e. start a little later than the selected time, or to jump back a predefined distance, e.g. one turn of the track, and read again. In an embodiment the control unit 20 is arranged for correcting the interpolated value by a margin parameter. The margin parameter may be a predefined value (e.g. from a standard) taken into account during recording, or it may be a global value for the actual recording on the information carrier. Because of subtracting the margin from the interpolated address the reading process starts earlier, and the selected unit is always after the starting point. Hence there is no need for jumping back. In an embodiment, where the access margin is present in the access list for substantially each interval, the control unit is arranged for retrieving the respective access margin for the interval comprising the specified point in playing time, and for correcting the estimated address by subtracting said access margin. An example of detailed formulas for the calculation is described above with reference to FIGS. 2 and 3.

In an embodiment of the playback device the control unit comprises a memory 51 and is arranged for storing the access list from the information carrier in the memory. The access list is stored in the memory 51 once when the information carrier is entered in the playback device. This speeds up further accessing operations.

FIG. 6 shows a recording device for writing information on a record carrier 11 according to the invention of a type which is (re)writable. During the writing operation, marks representing the information are formed on the record carrier. The marks may be in any optically readable form, e.g. in the form of areas with a reflection coefficient different from their surroundings, obtained when recording in materials such as a dye, an alloy or a phase change material, or in the form of areas with a direction of magnetization different from their surroundings, obtained when recording in magneto-optical material. Writing and reading of information on optical disks and the usual formatting, error correcting and channel coding rules are well-known in the art, e.g. from the CD system. The marks can be formed by means of a beam 24 of electromagnetic radiation, usually from a laser diode, focused to a spot 23 on the recording layer. The recording device comprises similar basic elements as the playback device described above with FIG. 5, i.e. a control unit 20, a drive means 21 and a positioning means 25, but it has a write head 39. Audio information is presented on the input of data compression means 35, which may be placed in a separate housing. Suitable compression means are described in the document mentioned in the introduction. The variable bitrate compressed data on the output of the compression means 35 are passed to a buffer 36. From the buffer 36 the compressed data is passed to data combination means 37 for combining these data and the playback parameters to a total data stream. The total data stream to be recorded is passed to writing means 38. The write head 39 is coupled to the writing means 38, which comprise for example a formatter, an error coder and a channel coder. The data presented to the input of the writing means 38 is distributed over logical and physical sectors according to formatting and encoding rules and converted into a write signal for the write head 39. The control unit 20 is arranged for controlling the buffer 36, the data combination means 37 and the writing means 38 via control lines 26 and for performing the positioning procedure as described above for the reading apparatus. The control unit 20 comprises a memory 61 for temporarily storing the playback parameters during recording. An embodiment of the recording device also comprises the features of the playback device and a combined write/read head and is suited for reading.

According to the invention the control unit 20 of the recording device is arranged for determining an access list having entries, each subsequent entry being assigned to a subsequent interval of a fixed playback time. The data combination means 37 are arranged for including the access list in the playback parameters. The length of the interval is set, and the control unit subdivides the input signal in intervals. For each interval a pointer to a unit within said interval is determined, usually the first unit. The pointer is entered in the access list, which is assembled in the memory 61. The access list, when completed, is stored from the memory to the information carrier. In an embodiment the control unit is arranged for determining an access margin parameter, as described with reference to FIG. 4. Further the recording apparatus or a corresponding recording method may be arranged to create embodiments of the information carrier as described above with reference to FIGS. 1a and 1b.

Although the invention has been explained by embodiments using a variably compressed audio format, the access list may also be applied for accessing any stored compressed real-time signal with a variable bitrate, such as MPEG2 video. For compressed MPEG2 video, the units comprise a sequence of video frames, and are called group Of Pictures (GOP). Also for the information carrier an optical disc has been described, but other media, such as a magnetic disc or tape, may be used. Further, the invention lies in each and every novel feature or combination of features described above.

What is claimed is:

1. A method, comprising:

compressing real-time information into units having variable amounts of compressed data; and determining playback parameters depending on the compressed data, the playback parameters including an access list having entries, each subsequent entry being assigned to a subsequent interval of a fixed playback time and containing a pointer to a unit for playing in the interval.

2. The method of claim 1, wherein the playback parameters include a length parameter indicative of the fixed playback time and/or a margin parameter indicative of a correction of a calculated pointer of a unit within the interval.

3. The method of claim 2, wherein the length parameter is selected substantially inversely proportional to a total playing time of the real-time information to be recorded and/or wherein the margin parameter is determined individually for several intervals, the individual margin parameters being included in the playback parameters.

4. A recorder comprising:

means for compressing real-time information into units having a variable amount of compressed data;

processing means for generating playback parameters depending on the compressed data; and recording means for recording the compressed data and the playback parameters; and wherein the playback parameters include an access list having entries, each subsequent entry being assigned to a subsequent interval of a fixed playback time and containing a pointer to a unit for playing in the interval.

5. The recorder of claim 4, wherein the playback parameters include a length parameter indicative of the fixed playback time and/or a margin parameter indicative of a correction of a calculated pointer of a unit within the interval.

* * * * *